(12) United States Patent
DeGendt et al.

(10) Patent No.: US 6,551,409 B1
(45) Date of Patent: Apr. 22, 2003

(54) METHOD FOR REMOVING ORGANIC CONTAMINANTS FROM A SEMICONDUCTOR SURFACE

(75) Inventors: Stefan DeGendt, Wijnegem (BE); Dirk Knotter, 's-Hertogenbosch (NL); Marc Heyns, Linden (BE); Marc Meuris, Keerbergen (BE); Paul Mertens, Haacht (BE)

(73) Assignees: Interuniversitair Microelektronica Centrum, vzw, Leuven (BE); Nederlandse Philips Bedrijven B.V. (NL)

( * ) Notice: Subject to any disclaimer, the term of this patent is extended or adjusted under 35 U.S.C. 154(b) by 0 days.

(21) Appl. No.: 09/156,437

(22) Filed: Sep. 18, 1998

Related U.S. Application Data

(63) Continuation-in-part of application No. 09/022,834, filed on Feb. 13, 1998.
(60) Provisional application No. 60/066,261, filed on Nov. 20, 1997, provisional application No. 60/042,389, filed on Mar. 25, 1997, and provisional application No. 60/040,309, filed on Feb. 14, 1997.

(51) Int. Cl.$^7$ .............................................. H01L 21/312
(52) U.S. Cl. ............................ 134/2; 134/1.3; 134/30; 134/31; 134/35; 134/36; 438/706; 438/725
(58) Field of Search ..................... 134/2, 3, 1.3, 28, 134/30, 31, 35, 36, 902; 438/706, 725

(56) References Cited

U.S. PATENT DOCUMENTS

| | | | |
|---|---|---|---|
| 4,695,327 A | | 9/1987 | Grebinski |
| 4,974,530 A | | 12/1990 | Lyon |
| 5,181,985 A | | 1/1993 | Lambert et al. |
| 5,244,000 A | * | 9/1993 | Stanford et al. ............ 134/95.1 |
| 5,308,745 A | | 5/1994 | Schwartzkopf |
| 5,378,317 A | * | 1/1995 | Kashiwase et al. .......... 438/704 |
| 5,423,944 A | * | 6/1995 | Wong .......................... 438/706 |
| 5,464,480 A | | 11/1995 | Matthews |
| 5,478,401 A | * | 12/1995 | Tsunekawa et al. ............. 134/1 |
| 5,503,708 A | | 4/1996 | Kiozumi et al. |
| 5,632,847 A | * | 5/1997 | Ohno et al. ................... 156/344 |
| 5,798,303 A | * | 8/1998 | Clampitt ........................ 438/696 |
| 5,998,305 A | * | 12/1999 | Holmer et al. ................ 438/795 |

FOREIGN PATENT DOCUMENTS

| | | | |
|---|---|---|---|
| EP | 0 327 263 A1 | 8/1989 | |
| EP | 0 344 764 B1 | 12/1989 | |
| EP | 0 344 764 A2 | 12/1989 | |
| EP | 0 548 596 A2 | 6/1993 | |
| EP | 0 548 596 | 6/1993 | |
| EP | 0 702 399 A1 | 3/1996 | |
| GB | 2 287 827 | 9/1995 | |
| JP | 52-100473 | 3/1979 | |
| JP | 63-16127 | 7/1989 | |
| JP | 2-192712 | 3/1992 | |
| JP | 405013398 | * 1/1993 | .......... H01L/21/304 |
| JP | 405259139 | * 10/1993 | .......... H01L/21/304 |
| JP | 1984-125760 | 1/1996 | |

OTHER PUBLICATIONS

Werner Kern, "Handbook of Semiconductor Wafer Cleaning Technology". pp. 420–421, 1993.*

(List continued on next page.)

Primary Examiner—Robert Kunemund
Assistant Examiner—Shamim Ahmed
(74) Attorney, Agent, or Firm—McDonnell Boehnen Hulbert & Berghoff

(57) ABSTRACT

A method for removing organic contaminants from a semiconductor surface whereby the semiconductor is held in a tank and the tank is filled with a fluid such as a liquid or a gas. Organic contaminants, such as photoresist, photoresidue, and dry etched residue, occur in process steps of semiconductor fabrication and at times, require removal. The organic contaminants are removed from the semiconductor surface by holding the semiconductor inside a tank. The method is practiced using gas phase processing. The tank is filled with a gas mixture, comprising water vapor and ozone.

32 Claims, 4 Drawing Sheets

Moist gas-phase experimental set-up

OTHER PUBLICATIONS

Sax and Lewis, (Hawley's condensed Chemical Dictionary 11th Edition, p. 867, 1987.*

Adler, Marilyn Grace and Hall, George Richard, "The Kinetics and Mechanism of Hydroxide Ion Catalyzed Ozone Decomposition in Aqueous Solution" *J.Am.Chem. Soc.*, vol. 72, pp. 1884–1886, 1950.

Heyns, M.M., et al., "New Wet Cleaning Strategies for Obtaining Highly Reliable Thin Oxides," MRP Symposium Proceedings on Materials Research Society, Spring Meeting, San Francisco, CA, Apr. 12–13.

K. Sehested, H. Corfitzen, J. Holcman, and Edwin J. Hart, "Decomposition of Ozone in Aqueous Acetic Acid Solutions (pH 0–4)" *J. Phys. Chem*, 1992, 96, 1005–1009.

Patent Abstracts of Japan, vol. 010, No. 141 (E–406), May 24, 1986 & JP 004232A.

JP 07 297163 A (Chlorine Eng Corp Ltd; Tokyo Shibuara Electric Co), Nov. 10, 1995.

* cited by examiner

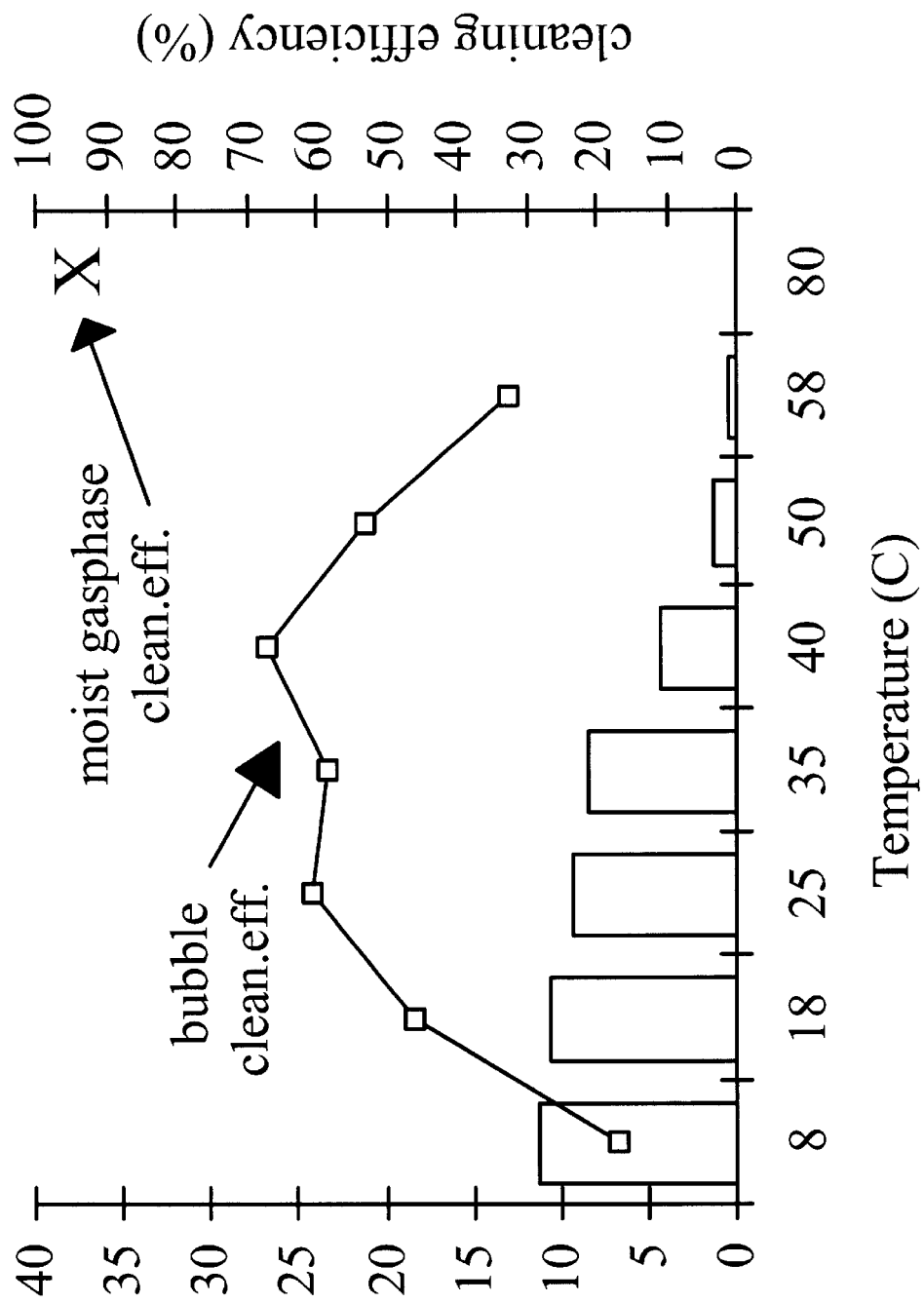
Figure 1 Resist removal efficiency as a function of temperature and ozone concentration for bubble and moist gasphase set-up.

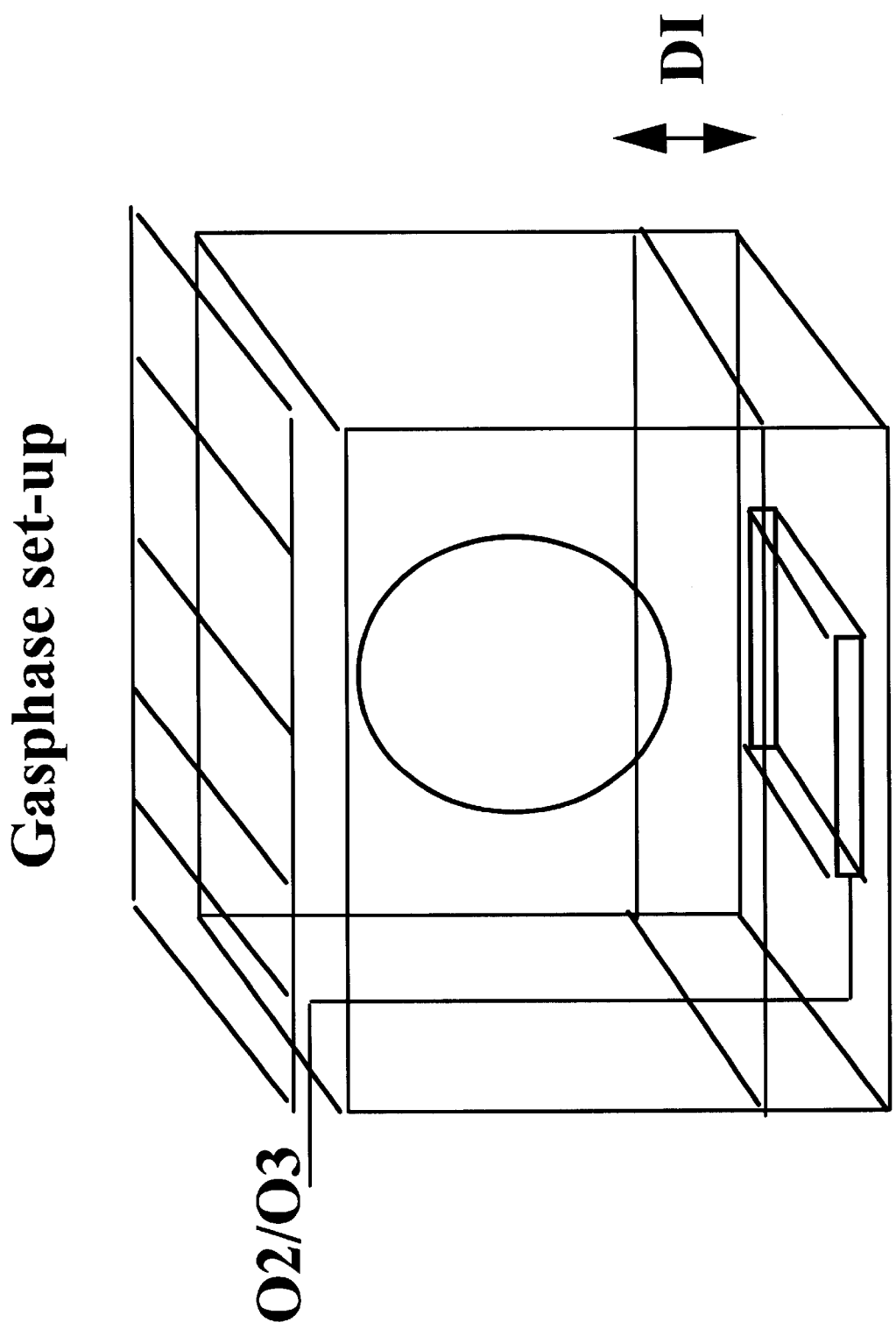
Figure 2 Moist gas-phase experimental set-up

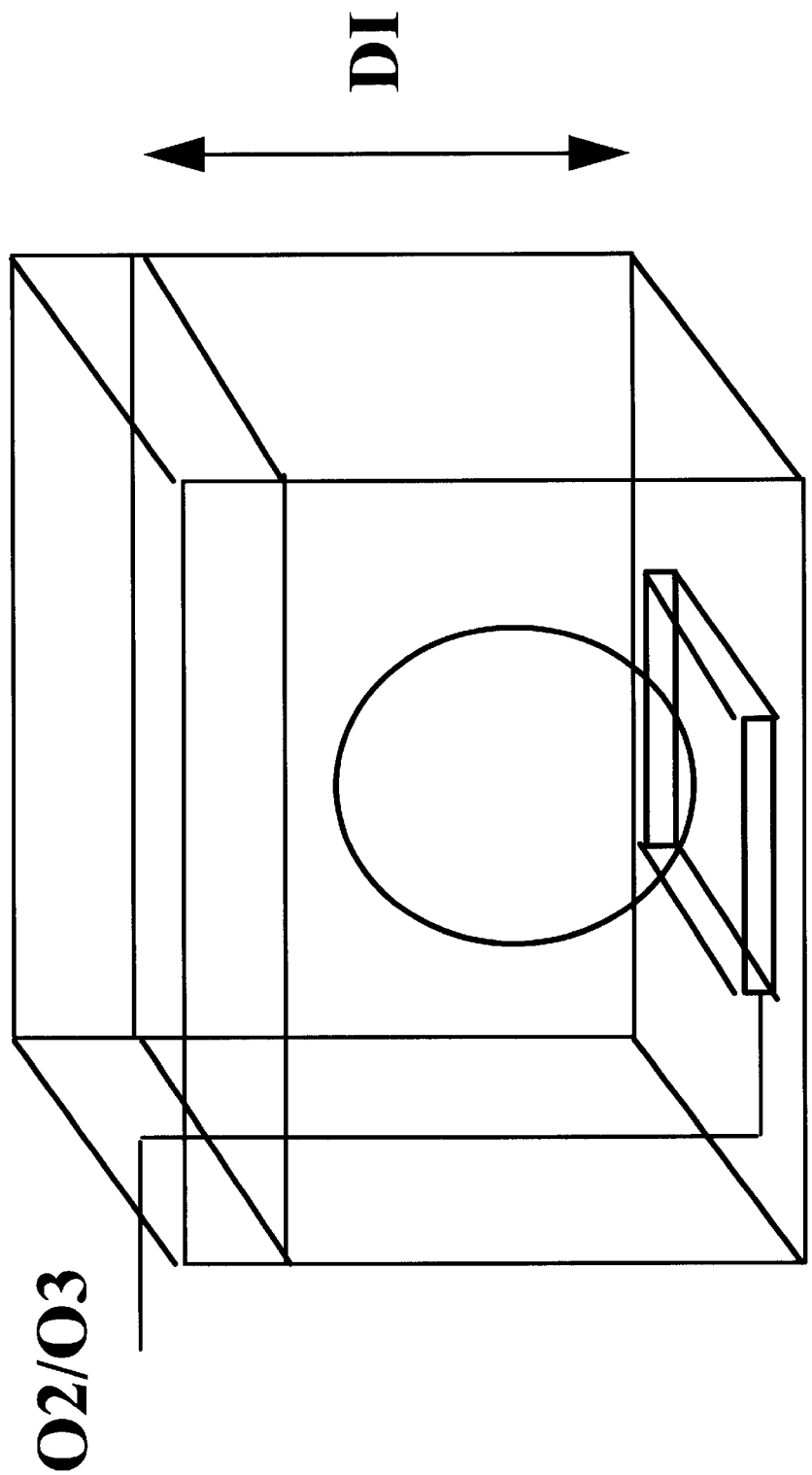
Figure 3 Ozone bubble immersion experimental set-up

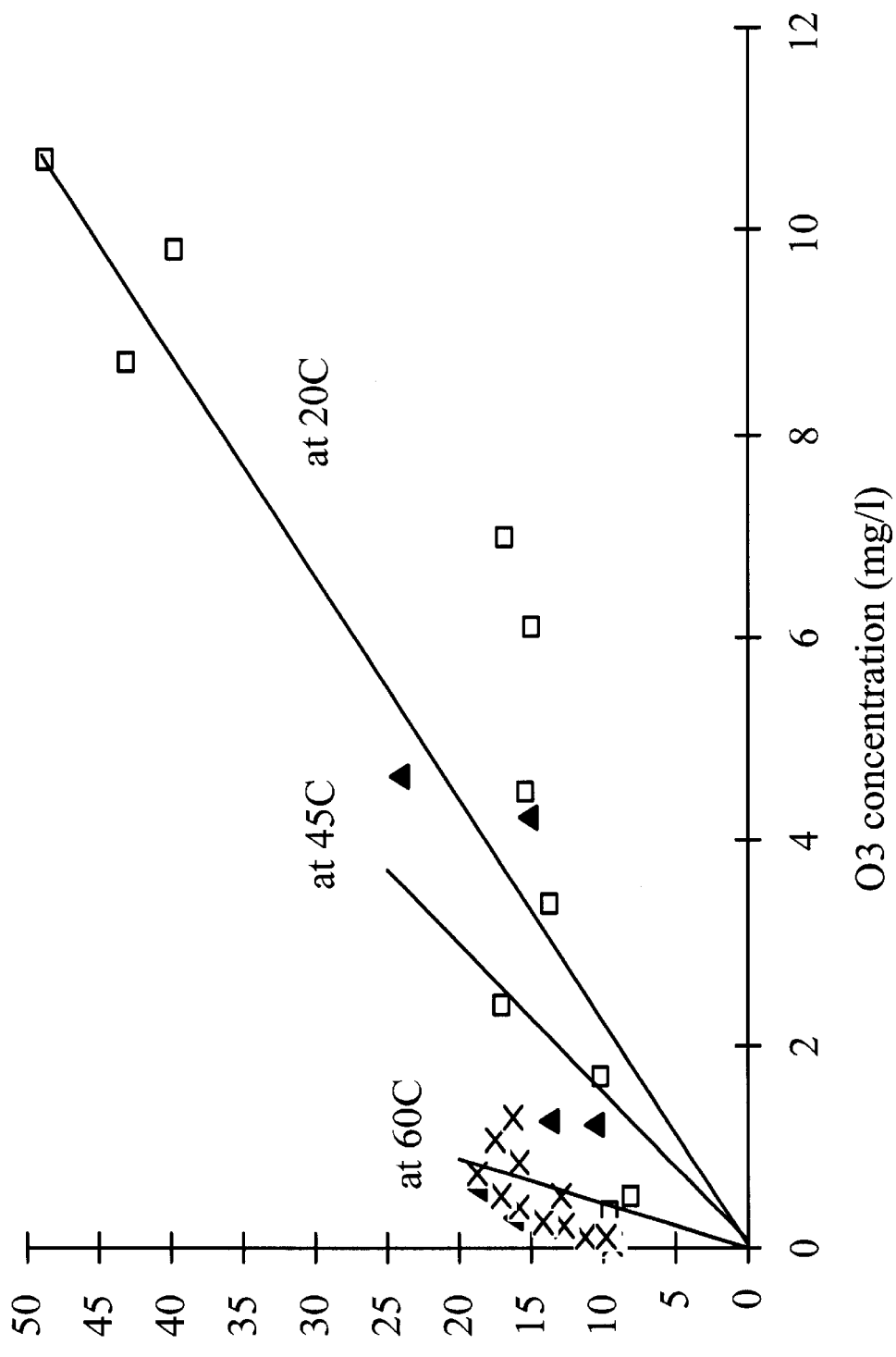
Figure 4: Resist removal efficiency as a function of temperature and ozone concentration for a static system

METHOD FOR REMOVING ORGANIC CONTAMINANTS FROM A SEMICONDUCTOR SURFACE

REFERENCE TO RELATED APPLICATIONS

This application is a continuation-in-part of U.S. patent application Ser. No. 09/022,834 filed on Feb. 13, 1998 and claims priority benefits under 35 U.S.C. §119(e) to U.S. provisional application Ser. No. 60/040,309, filed on Feb. 14, 1997, to U.S. provisional application Ser. No. 60/042,389, filed on Mar. 25, 1997, and to U.S. provisional application Ser. No. 60/066,261, filed on Nov. 20, 1997.

BACKGROUND OF THE INVENTION

A. Field of the Invention

The present invention is related to a method for removing organic contaminants from a semiconductor surface.

The present invention is also related to the use of this method for specific applications such as cleaning steps after VIA etching and other etch processes.

B. Description of Related Art

The semiconductor surface preparation prior to various processing steps such as oxidation, deposition or growth processes, has become one of the most critical issues in semiconductor technology. With the rapid approach of sub halfmicron design rules, very small particles and low levels of contamination or material impurities ($\sim 10^{10}$ atoms/cm$^2$ and lower) can have a drastic effect on process yields. The contaminants that are to be removed from a semiconductor surface include metallic impurities, particles and organic material. A commonly used technique to reduce foreign particulate matter contamination level on semiconductor surfaces is the immersion of wafers in chemical solutions.

Organic material is one of the contaminants that has to be removed from the semiconductor wafer surface. In a pre-clean stage, absorbed organic molecules prevent cleaning chemicals from contacting with the wafer surface, thus leading to non-uniform etching and cleaning on the wafer surface. In order to realize contamination free wafer surfaces, organic impurities have to be removed before other wafer cleaning processes. Traditional wet cleaning processes involve the use of sulfuric peroxide mixtures (SPM) to remove organic molecules. However, SPM uses expensive chemicals and requires high processing temperatures, and causes problems in terms of chemical waste treatment.

Other sources of organic contamination also arise during a standard IC process flow. Such sources can be photoresist layers or fluorocarbon polymer residues that are deposited on a substrate.

The fluorocarbon residues originate from the exposure of semiconductor (silicon) substrates to dry oxide etch chemistries. In conventional oxide etching with fluorocarbon gases, an amount of polymer is intentionally generated in order to achieve a vertical sidewall profile and better etch selectivity to the photoresist mask and underlying film. Etch selectivity in a $SiO_2$—Si system can be achieved under certain process conditions through the formation of fluorocarbon based polymers. The polymerisation reaction occurs preferably on Si, thus forming a protective coating and etch selectivity between Si and $SiO_2$. After selective etching, both resist and polymer-like residue must be removed from the surface. If the polymer is not completely removed prior to the subsequent metal deposition, the polymer will mix with sputtered metal atoms to form a high resistance material resulting in reliability concerns. Methods of polymer removal depend on the plasma etch chemistry, plasma source and the composition of the film stack. However, for dry processes, the application of O2 or H2 containing gases have been applied to remove the fluorocarbon polymers. For wet cleaning techniques an amine based solvent (U.S. Pat. No. 5,279,771 and U.S. Pat. No. 5,308,745, which are hereby incorporated by reference) is frequently applied. Organic photoresist removal generally involves wet or dry oxidative chemistries (i.e. O2 plasma, SPM) or dissolution processes based on solvent strippers. These processes are both expensive and environmentally harmful in terms of waste treatment.

In an attempt to find alternative efficient cleans for the removal of organic contamination (including photoresist and etch residues) from Si surfaces, the use of ozonated chemistries has been investigated. Ozone has been used extensively in the field of waste water treatment and drinking water sterilisation, because of its strong oxidising power. An additional benefit of ozone is its harmless residue after decomposition and/or reaction ($H_2O$, $CO_2$, $O_2$). It is generally presumed that oxidative action of ozone towards organic contamination involves two different oxidation pathways, either direct oxidation or advanced oxidation. Direct oxidation or ozonolysis involves molecular ozone as the prime oxidant. It predominantly occurs at carbon-carbon double bonds. This type of oxidation is favored in the low pH region of the waste water. Advanced oxidation involves secondary oxidants as the prime oxidant (e.g. OH radicals). This type of oxidation is more reactive, but less sensitive and is predominant at conditions that favor OH radical formation, such as high pH, elevated temperature, addition of enhancers (e.g. $H_2O_2$), UV radiation. In real life situations, one often deals with a mixture of contaminants having a different reactivity towards ozone. However, both oxidation pathways are concurrent and conditions that favor advanced oxidation pathways will occur at the expense of the efficiency of eliminating organic contamination with higher reactivity towards molecular ozone. In order to optimize the organic removal efficiency of ozonated chemistries, it is critical to identify the parameters that influence both oxidation pathways.

In recent years, ozone was introduced in the microelectronics industry because of its strong oxidizing capabilities. When ozone gas is dissolved into water, its self-decomposition time gets shorter compared to the gaseous phase. During self-decomposition, ozone generates OH radicals as a reaction by-product, which is according to G. Alder and R. Hill in J. Am. Chem. Soc. 1950, 72 (1984), hereby incorporated by reference, believed to be the reason for decomposition of organic material.

U.S. Pat. No. 5,464,480, which is hereby incorporated by reference, describes a process for removing organic material from semi-conductor wafers. The wafers are contacted with a solution of ozone and water at a temperature between 1° and 15° C. Wafers are placed into a tank containing deionized water, while diffusing ozone into the (sub-ambient) deionized water for a time sufficient to oxidize the organic material from the wafer, while maintaining the deionized water at a temperature of about 1° to about 15° C., and thereafter rinsing the wafers with deionized water. The purpose of lowering the temperature of the solution to a range between 1° and 15° C. is to enable sufficiently high ozone concentrations into water to oxidize all of the organic material onto the wafer into insoluble gases.

European Patent Application EP-A-0548596 describes a spray-tool process, whereby during the cleaning process, various liquid chemicals, ultra-pure water or a mixed phase fluid comprising an ozone-containing gas and ultra pure water are sprayed onto substrates or semiconductor wafers in a treating chamber filled with ozone gas. Rotation is necessary to constantly renew thin films of treating solution and promoting removal of undesired materials by means of centrifugal force. It is concluded in this application that heating the substrate does not permit ozone to have well enough effects.

U.S. Pat. No. 5,181,985, which is hereby incorporated by reference, describes a process for the wet-chemical surface treatment of semiconductor wafers in which aqueous phases containing one or more chemically active substances in solution act on the wafer surface, with water in a finely divided liquid state such as a mist. The process consists of spraying the water mist over the wafer surface and then introducing chemically active substance in the gaseous state so that these gaseous substances are combined with the water mist in order to have an interaction of the gas phase and the liquid phase taking place on the surface of the semiconductor wafers. The chemical active substance are selected from the group consisting of gases of ammonia, hydrogen chloride, hydrogen fluoride, ozone, ozonized oxygen, chlorine and bromine. The water is introduced into the system at a temperature of 10° C. to 90° C.

U.S. Pat. No. 5,503,708, which is hereby incorporated by reference, describes a method and an apparatus for removing an organic film wherein a mixed gas including an alcohol and one of ozone gas and an ozone-containing gas is supplied into the processing chamber at least for a period before that the semiconductor wafer is placed in said processing chamber, so that the mixed gas will act on the organic film formed on the surface of the semiconductor wafer.

AIMS OF THE PRESENT INVENTION

The present invention aims to suggest an improved method for the removal of organic contaminants from a semiconductor substrate.

More particularly, the present invention aims to suggest a method of removal of organic contamination such as photoresist, photoresidue, dry etched residue which can occur in any process step of the fabrication of semiconductor substrate.

Another aim of the invention is the removal of organic contamination from substrates, e.g. photoresist and photoresist residues, dry etch residues, from substrates during any process step of fabrication. The invention can be used in the fabrication of silicon wafers for Integrated Circuits. The invention can also be used in related fields, like the fabrication of flat panel displays, solar cells, or in micromachining applications or in other fields wherein organic contaminants have to be removed from substrates.

SUMMARY OF THE PRESENT INVENTION

A method and apparatus for removing organic contaminants from a substrate is disclosed.

The method comprises the steps of holding said substrate in a tank or reaction chamber, and filling said tank or chamber with a first gas mixture comprising water vapour and ozone. Preferably said substrate is thereafter rinsed with a fluid. The term tank for the purpose of this patent application is meant to cover any kind of tool or reaction chamber wherein substrates are held for the purpose of cleaning or removing organic contaminants. Thus the term tank is to cover tools or reaction chambers known in the art such as wet benches, vessels, spray processors, spinning tools, and single wafer cleaning tools.

The method is to be executed at a temperature higher than room temperature. The temperature can be in the range of 30–90° C., preferably 50 or 80° C., or higher. Thus the water can be a water vapour. It can also be water in the actual gas phase. A vapour is defined as the the gas phase occurrence of an element or a compound or a mixture of elements if the element or compound or mixture should be in the liquid or solid phase at the given temperature and pressure conditions. Thus a vapour can co-exist in one environment with the solid or liquid phase of the element. A vapour therefore also is not a mist of finely dispersed liquid droplets of an element or a compound or a mixture of elements. A vapour is a specific gas phase occurrence of an element or a compound or a mixture of elements. The method of the invention can comprise the steps of holding said substrate in a tank, said substrate being at a temperature above room temperature, filling said tank with a gas mixture comprising water and ozone in the gaseous phase; and optionally thereafter rinsing said substrate with a fluid. The method can also comprise the steps of filling said tank with water, the water level in said tank remaining below said substrate; heating the water thereby creating a water gas or a water vapor in said tank while filling said tank with ozone. The ozone can possibly be bubbled through the water. The rinse fluid can comprise water, the water level being elevated to have said substrate immersed in said fluid. Said fluid can further comprise HCl and/or HF and/or HNO$_3$ and/or CO$_2$ and/or H$_2$SO$_4$. Preferably the fluid is at 90° C. and comprises 5% H$_2$SO$_4$ in H$_2$O$_2$. The fluid can also be subjected to megasone agitation.

The apparatus for removing organic contaminants from a substrate comprises a tank with a first inlet for ozone gas and a second inlet for a fluid, said second inlet being adapted for filling said tank to a plurality of predetermined fluid levels, said first inlet being adapted for diffusing said ozone gas, possibly through said fluid in said tank. The tank further comprises a substrate holder for holding said substrate in said tank, at least one of said predetermined fluid levels being under said substrate and means for heating said fluid above room temperature for creating a fluid vapor at a predetermined concentration level in said tank. The tank or chamber can also comprise means for heating said wafer. The ozone gas can be led through a bubbler or diffuser in the bottom of a tank, holding the substrate or a plurality of substrates. Note that the tank can be used to hold a cassette with substrates or to hold the substrates cassetteless. Water is fed into the tank through the water inlet. In a preferred embodiment, the water can be circulated through a tube with the opening above the ozone diffuser. In this way the ozone gas will be led through the water. By recirculating the water over a heater or a heat exchanger, the temperature of the water may be regulated and this will regulate the amount of water vapour inside the system. In another embodiment, the walls of the tank may be heated to regulate also the temperature of the substrates. This can be done for instance by means of IR or lamp heating, or using heated ozone. After the first process with water vapour and ozone is finished, rinse liquid will be filled inside the tank until it overflows. Then an option could be to recirculate this liquid several times over the substrates or the liquid may be drained immediately. The liquid preferably comprises water. The liquid can be heated and further comprise additives such as HF, HCl, HNO$_3$ or CO$_2$ or H$_2$SO$_4$.

BRIEF DESCRIPTION OF THE DRAWINGS

FIG. 1 represents the resist removal efficiency as a function of the temperature and ozone concentration in immersed liquid or gasphase processing.

FIG. 2 is a representation of the experimental set-up used in the gas phase processing.

FIG. 3 represents the experimental set-up of liquid phase processing.

FIG. 4 represents the resist removal efficiency as a function of the temperature and the ozone concentration in a static system.

DETAILED DESCRIPTION OF SEVERAL EMBODIMENTS OF THE PRESENT INVENTION

This application is a continuation-in-part of U.S. patent application Ser. No. 09/022,834 filed on Feb. 13, 1998, and is hereby incorporated by reference.

The purpose of the present invention is related to a method for removing organic contamination from a substrate. Said substrate can be a semiconductor wafer.

Said method can be applied for the removal of photoresist and organic post-etch residues from silicon surfaces. Said organic contamination can be a confined layer covering at least part of said substrate. Said confined layer can have a thickness in a range of submonolayer coverage to 1 μm. Said method is applicable for either gasphase or liquid processes.

In the following specification, a preferred embodiment of the invention for gas phase processing is detailed.

DESCRIPTION OF THE BEST MODE EMBODIMENT OF THE INVENTION

The present invention is related to a method for removing organic contaminants from a substrate comprising the steps of holding said substrate in a tank, filling said tank with a gas mixture comprising water vapor and ozone, said first gas mixture being at a temperature higher than the room temperature. The pressure conditions in the tank are about atmospheric conditions. Thereafter said substrate can be rinsed with a fluid. Furthermore, the method can comprise the steps of supplying water to said tank, the water level in said tank remaining below said substrate, heating the water thereby creating the water vapor in said tank while filling said tank with ozone gas.

In the best mode embodiment of the invention, rather than having an ozone gas flow and immersing the wafers into DI water as in a prior art embodiment, a gasphase moist ozone ambient is created in a tank. The gasphase moist ozone ambient is thus a mixture of water vapour and ozone. The tank can be a sealed container (see FIG. 2). In an example of the invention, photoresist (PR) coated wafers are exposed for 10 min to moist ozone in a sealed container. Thus, the example embodiment is performed in a gas phase water/ozone atmosphere. The latter is achieved by heating a minimal amount (3 cm) of water to 80° C., while ozone is bubbled through the DI water in the sealed container. After exposure for 10 min to the gasphase ambient of ozone and water, wafers are rinsed in DI water for 10 min. The sealed container is to be filled with only a minute amount of liquid, sufficient to fully immerse an $O_3$ diffuser. The liquid is DI water. A lid is put on the quartz container. Wafers are placed above the liquid interface but are not immersed. The ozone diffusor is fabricated from fused silica, and the ozone generator (Sorbius) is operated with an oxygen flow which maximizes the ozone content in the gas flow. In the best mode embodiment, a flow of 3 /min $O_2$ is used. At all times, the ozone is bubbled directly into the liquid (no bubble reduction). Heating of the liquid in a sealed container and continuous $O_3$ bubbling through the liquid exposes the wafers to a moist $O_3$ ambient. Wafers are to be processed sufficiently long and a rinse step follows the moist gas phase treatment. In the best mode embodiment, wafers are processed for 10 minutes, and subsequently rinsed in DI water for 10 minutes.

The gas phase processing of photoresist contaminated wafers according to this example of the invention can be summarised as submitting the wafers to a moist ozone ambient at 80° C. Typically, after ten minutes exposure all PR residues can be washed during a subsequent rinse in DI water. According to this embodiment, there is 100% cleaning efficiency. It is to be noted that after a step in a dry ozone ambient, the photoresist (PR) layer is not affected and there is no cleaning effect observable.

Resist Removal

In a further study of the method of the present invention, an experiment is described hereunder.

The main requirement for the ozonated chemistries is fast and complete removal of organic contaminants (e.g. clean room air components, photoresist or side-wall polymers). Critical parameters influencing the removal efficiency are to be identified. However, also other parameters such as ozone concentration and temperature are likely important. Therefore, the impact of $O_3$ concentration and operational temperature for positive resist removal efficiency was evaluated experimentally. Wafers coated with a 5 nm thick photoresist coating were prepared and immersed in a static bath containing DI water (set-up as in FIG. 3, and ozone bubbling off during immersion). Ozone concentration was varied between 0 and 12 ppm, and temperature between 20, 45 and 70° C. Purposely, 1 min cleans are done in static conditions (i.e. gas flow off, after $O_3$ saturation of DI), to assess the parameter impact. Principal results are shown in FIG. 4, where cleaning efficiency is plotted versus $O_3$ concentration for the three different temperature ranges. Removal is only 50% due to the small processing time and static conditions (limited ozone availability). It can be seen that cleaning efficiency per unit of ozone, is more performing at elevated temperatures, while total removal in the time frame studied is more performing at higher ozone concentration. However, $O_3$ solubility decreases with temperature, while process performance increases with temperature.

Ozone concentration in solution, and thus oxidizing capabilities and cleaning performance can be maximized relying on physical aspects. One process, described previously in U.S. Pat. No. 5,464,480 operates the water at reduced temperature (chilled), in order to increase ozone solubility. Disadvantages are the lowered reactivity and longer process times due to reaction kinetics. Another possibility to improve the ozone concentration is using more efficient ozone generators and/or ozone diffusor systems to transfer ozone into the DI water. From the above observations however, it is believed that any optimized process should aim at maximizing the $O_3$ concentration at operating temperatures. This assumption is demonstrated with the set-up shown in FIG. 2, where a moist gasphase process at elevated temperature is presented (to be compared with traditional immersion with bubble contact at subambient, ambient and elevated temperatures). Description of the set-up is given above. Positive resist wafers (1.2 nm) are exposed for 10 min, at various temperatures (bubble), or at 80° C. (gasphase). Results are shown in FIG. 1. Dissolved $O_3$ concentration for bubble experiment (bar graph) and cleaning efficiency (line graph and cross) is shown. The cleaning behavior for the bubble experiment is understood from a process limited by kinetic factors in the low temperature range and by ozone solubility in the higher temperature range. The latter limitation is reduced for the moist ozone ambient experiment. By exposing the wafer to a moist atmosphere, a thin condensation layer is formed on the wafer. The $O_3$ gas ambient maintains a continuous high supply of $O_3$ (wt % $O_3$ in gas, ppm in solution). Also, the thin condensation layer reduces the diffusion limitation and allows the shortliving reactive $O_3$ components to reach the wafer surface, resulting in near 100% removal. Important to note is the fact that the gasphase process, in the absence of moist is unsuccessful.

The results of this study confirm the conclusions that if the ozone concentration near the surface of a wafer can be increased, a better cleaning efficiency can be achieved at elevated temperatures. The shape of the cleaning efficiency curve indicates the validity of a model, that on the low temperature side, the cleaning efficiency is controlled by a kinetic factor, while on the high temperature side, the cleaning efficiency is controlled by a concentration factor. In this respect, the ozone concentration data as presented in FIG. 1 should be interpreted with care, as it represents the ozone concentration dissolved into the DI water. The dissolved ozone concentration follows the expected trend with temperature, however, the continuous gasflow (about 3% $O_3$ at experimental conditions) through the DI water delivers high ozone concentration near the wafer surface. Therefore, although sometimes, a thicker PR layer (1100 nm vs 4 nm) has to be removed, highest cleaning efficiency is obtained in the temperature range between 25 and 40° C.

Removal of organic contamination by means of ozonated chemistries is determined by a kinetic and a concentration factor. The kinetic factor is controlled by the operating temperature, and high temperature results in more efficient cleaning. However elevated temperatures have a negative impact on the concentration factor, if working in an immersion bath. Nevertheless, the impact of temperature on the concentratration factor can be greatly reduced by increasing the ozone concentration near the wafer surface. This is achieved by either working in solution under continuous ozone gasflow, or by working in gasphase. The importance of water in the removal process indicates that water either catalyzes the cleaning process, or a reaction product between ozone and water (formation of OH radicals) is the reactive species rather than ozone itself. The latter may be an additional explanation for the improved efficiency in the gasphase embodiment of the invention. Besides of the higher overall ozone concentration, the presence of reactive products near the wafer surface is also higher, and a continuous supply exists.

The same conclusion holds for the gasphase experiment of the best mode embodiment of the invention.

In this case, the cleaning efficiency is almost 100% while the experiment was performed at 80° C. Once again, by working in gasphase, the concentration factor is no longer limiting the cleaning reaction, and the kinetic factor becomes rate determining. The observation that dry ozone does not result in removal of PR indicates the importance of water in the cleaning process.

Alternate Embodiments

According to alternative embodiments of the invention, the process temperatures could be in the range of 25–90° C., or 30–300° C., or 90–300° C. or 100° C. or higher.

In the process of the invention, substrates are placed in a tank such that the substrates are in contact with a gas mixture containing water and ozone.

Said gas mixture can also contain oxygen, nitrogen, argon or any other inert gas. Also other gases such as HF, HCl, $HNO_3$, $Cl_2$, $F_2$, or $Br_2$ can be added to the gas mixture. The ozone concentration of said gas mixture is typically below 10% molar weight. The water vapor is typically saturated at the operational temperature of said mixture.

Said method also comprises a step of rinsing said substrate with a solution. Said rinsing solution comprises preferably de-ionized water. Said rinsing solution can further comprise HCl and/or HF and/or $HNO_3$ and/or $CO_2$ and/or $O_3$ and/or $H_2SO_4$. Said rinsing solution can also be subjected to megasone agitation.

From the foregoing detailed description, it will be appreciated that numerous changes and modifications can be made to the aspects of the invention without departure from the true spirit and scope of the invention. This true spirit and scope of the invention is defined by the appended claims, to be interpreted in light of the foregoing specification.

We claim:

1. A method for removing organic contaminants from a substrate, comprising the steps of:

holding said substrate in a tank, said substrate having at least one side;

filling said tank with a gas mixture comprising water vapour and ozone, said gas mixture being at a temperature higher than room temperature; and contacting at least a portion of one side of the substrate with the gas mixture, wherein the gas mixture removes the organic contaminants from the at least one side of the substrate, and wherein said step of filling said tank with a gas mixture comprises the steps of:

supplying to said tank a solution comprising water, the solution level in said tank being substantially below said substrate;

heating the solution thereby creating a vapor comprising water in said tank; and filling said tank with ozone gas.

2. The method as recited in claim 1 wherein said temperature is higher than about 30° C.

3. The method as recited in claim 2 wherein said temperature is in the range of 30–120° C.

4. The method as recited in claim 3 wherein said temperature is in the range of 50–90° C.

5. The method as recited in claim 4 wherein said temperature is about 80° C.

6. The method as recited in claim 1 wherein the solution is heated to a temperature in the range of 50–90° C.

7. The method as recited in claim 6 wherein the solution is heated to a temperature of 80° C.

8. The method as recited in claim 1 wherein said step of filling said tank with ozone gas comprises the step of bubbling ozone through the solution.

9. The method as recited in claim 1 wherein said step of filling said tank with ozone gas comprises the step of bubbling a gas mixture comprising ozone through the solution.

10. The method as recited in claim 9 wherein said gas mixture comprises ozone and also comprises at least one gas selected from the group consisting of oxygen, nitrogen and argon.

11. The method as recited in claim 9 wherein the gas mixture comprises at least one additive selected from the group consisting of HF, HCl, $HNO_3$, $Cl_2$, $F_2$, and $Br_2$.

12. The method as recited in claim 1 further comprising the step of rinsing said substrate with said solution, the solution level being elevated to have said substrate immersed in said solution.

13. The method as recited in claim 1 further comprising the step of rinsing said substrate with a fluid.

14. The method as recited in claim 13 wherein said fluid comprises water.

15. The method as recited in claim 14 wherein said fluid further comprises at least one additive selected from the group consisting of HCl, HF, $HNO_3$, $CO_2$ and $H_2SO_4$.

16. The method as recited in claim 14 wherein said fluid is subjected to megasone agitation.

17. A method for removing organic contaminants from a substrate comprising the steps of:

holding said substrate in a tank, said substrate having at least one side, said substrate being at a temperature higher than room temperature;

filling said tank with a gas mixture comprising water vapour and ozone; and contacting at least a portion of one side of the substrate with the gas mixture, wherein the gas mixture removes the organic contaminants from the at least one side of the substrate; and wherein said step of filling said tank with a gas mixture comprising water vapour and ozone comprises the steps of:

supplying to said tank a solution comprising water, the solution level in said tank remaining substantially below said substrate;

heating the solution thereby creating a vapor comprising water in said tank; and filling said tank with ozone gas.

18. The method as recited in claim 17 further comprising the step of rinsing said substrate with a fluid.

19. The method as recited in claim 17 wherein said temperature is higher than about 30° C.

20. The method as recited in claim 17 wherein said temperature is in the range of 30–120° C.

21. The method as recited in claim 20 wherein said temperature is in the range of 50–90° C.

22. The method as recited in claim 21 wherein said temperature is about 80° C.

23. The method as recited in claim 17 wherein the solution is heated to a temperature in the range of 50–90° C.

24. The method as recited in claim 23 wherein ozone is bubbled through the solution.

25. The method as recited in claim 17 wherein a gas mixture comprising ozone is bubbled through the solution.

26. The method as recited in claim 17 wherein a gas mixture, comprising ozone and at least one gas selected from the group consisting of oxygen, nitrogen and argon, is bubbled through the water.

27. The method as recited in claim 26 wherein the gas mixture comprises at least one additive selected from the group consisting of HF, HCl, $HNO_3$, $Cl_2$, $F_2$, and $Br_2$.

28. The method as recited in claim 18 wherein said fluid comprises water.

29. The method as recited in claim 28 wherein said fluid further comprises at least one additive selected from the group consisting of HCl, HF, $HNO_3$, $CO_2$ and $H_2SO_4$.

30. The method as recited in claim 29 wherein said fluid is subjected to megasone agitation.

31. The method as recited in claim 1, wherein contacting at least a portion of the one side with the gas mixture condensates water on the at least a portion of the one side of the substrate.

32. The method as recited in claim 17, wherein contacting at least a portion of the one side with the gas mixture condensates water on the at least a portion of the one side of the substrate.

* * * * *